United States Patent
Lin et al.

(10) Patent No.: US 8,921,217 B2
(45) Date of Patent: Dec. 30, 2014

(54) METHODS OF FORMING GATE STRUCTURES FOR REDUCED LEAKAGE

(75) Inventors: Wuu-Cherng Lin, San Jose, CA (US); Fangyun Richter, San Jose, CA (US); Che Ta Hsu, San Jose, CA (US); Wen Sun Wu, Bayan Lepas (MY)

(73) Assignee: Altera Corporation, San Jose, CA (US)

( * ) Notice: Subject to any disclaimer, the term of this patent is extended or adjusted under 35 U.S.C. 154(b) by 405 days.

(21) Appl. No.: 13/331,055

(22) Filed: Dec. 20, 2011

(65) Prior Publication Data
US 2013/0157451 A1    Jun. 20, 2013

(51) Int. Cl.
*H01L 21/3205* (2006.01)
*H01L 21/4763* (2006.01)

(52) U.S. Cl.
USPC ............... 438/587; 438/197; 257/E21.294; 716/110

(58) Field of Classification Search
USPC ............ 438/197, 587; 257/48, 288, E21.294, 257/393, 399, 402, E21.637, E27.06; 716/50–53, 110–112
See application file for complete search history.

(56) References Cited

U.S. PATENT DOCUMENTS

| | | | |
|---|---|---|---|
| 7,287,171 B1 * | 10/2007 | Mendel et al. | 713/300 |
| 7,730,432 B1 | 6/2010 | Gupta et al. | |
| 2006/0038171 A1 * | 2/2006 | Hasumi et al. | 257/48 |
| 2006/0288321 A1 | 12/2006 | Shibayama | |
| 2009/0072857 A1 | 3/2009 | Perisetty et al. | |

OTHER PUBLICATIONS

Rahim et al., U.S. Appl. No. 12/478,713, filed Jun. 9, 2009.
Li et al., U.S. Appl. No. 12/250,465, filed Oct. 13, 2008.

\* cited by examiner

*Primary Examiner* — Charles Garber
*Assistant Examiner* — Abdulfattah Mustapha
(74) *Attorney, Agent, or Firm* — Treyz Law Group; Jason Tsai (57) ABSTRACT

Integrated circuits containing transistors are provided. A transistor may include a gate structure formed over an associated well region. The well region may be actively biased and may serve as a body terminal. The well region of one transistor may be formed adjacent to a gate structure of a neighboring transistor. If the gate structure of the neighboring transistor and the well region of the one transistor are both actively biased and are placed close to one another, substantial leakage may be generated. Computer-aided design tools may be used to identify actively driven gate terminals and well regions and may be used to determine whether each gate-well pair is spaced sufficiently far from one another. If a gate-well pair is too close, the design tools may locate an existing gate cut layer and extend the existing gate cut layer to cut the actively driven gate structure.

20 Claims, 9 Drawing Sheets

METHODS OF FORMING GATE STRUCTURES FOR REDUCED LEAKAGE

BACKGROUND

This invention relates to integrated circuits, and more particularly, to integrated circuits that include memory. Integrated circuits often contain memory elements such as random-access memory cells for storing data.

On programmable integrated circuits, memory elements can be used to store configuration data. Once loaded with a configuration data bit, a memory element can supply a static control signal to the gate of a programmable logic transistor (often referred to as a pass transistor). The logic high or logic low state of the configuration bit determines whether the pass transistor is turned on or off. By configuring numerous pass transistors, programmable logic on a programmable integrated circuit can be configured to perform a custom logic function.

Pass transistors that receive the static control signals from the memory elements are typically formed from n-channel transistors. When a low voltage is applied to the gate of an n-channel pass gate, the pass gate will be turned off and signals will be prevented from passing between its source-drain terminals. When a high voltage is applied to the gate of an n-channel pass gate, signals are allowed to pass between its source-drain terminals.

Due to the electrical properties of n-channel metal-oxide-semiconductor transistors, it is difficult to pass a logic one value between the source-drain terminals of an n-channel pass transistor if the controlling voltage that is applied to the gate of the pass transistor has the same magnitude as the logic one value. As a result, programmable integrated circuits are sometimes provided with memory elements that supply static control signals at elevated voltage levels. These elevated control signals overdrive the pass transistors when the pass transistors are turned on thereby improving its drive strength.

The memory elements that supply the elevated control signals are biased using an elevated positive power supply voltage (i.e., a positive power supply voltage greater than the nominal positive power supply voltage that is used to power the remaining logic circuits on the programmable integrated circuit). Biasing memory elements in this way may, however, result in increased leakage and power consumption. For example, a memory element may include first and second cross-coupled inverters each having an n-channel transistor coupled in series with a p-channel transistor. When the memory element is storing a given data bit, the n-channel transistor in the first inverter may be turned on while the n-channel transistor in the second inverter may be turned off. The n-channel transistor that is turned off will have a drain terminal that receives the elevated positive power supply voltage and a gate terminal, source terminal, and body (bulk) terminal that receives a ground voltage. An n-channel transistor biased as such may experience substantial leakage current flowing from its drain terminal into its body terminal due to gate-induced drain leakage effects, band-to-band tunneling, avalanche breakdown, and other sub-threshold leakage effects.

In an effort to mitigate this type of leakage, techniques have been developed that involve reverse biasing the body terminals of the n-channel transistors in the memory elements (i.e., by supplying the body terminals with a negative voltage). Biasing the body terminal using negative voltages to increase the reverse bias between the source and body terminals will serve to increase the transistor threshold voltage, thereby reducing sub-threshold leakage.

If, however, the bulk of the n-channel transistor is formed near an actively driven gate structure of an adjacent transistor (i.e., where the gate structure of the adjacent transistor is biased to some positive voltage level), the voltage difference between that gate structure and the bulk of the n-channel transistor will generate an unacceptable amount of leakage current (due to hot carrier injection mechanisms). This effect is exacerbated in modern integrated circuit fabrication processes in which transistors are formed closer to one another. As a result, leakage current flowing from a positively driven gate terminal of one transistor to a reverse biased bulk terminal of a closely formed neighboring transistor may negate any leakage improvement achieved using conventional reverse biasing techniques.

SUMMARY

Integrated circuits with transistors are provided. A metal-oxide-semiconductor transistor may, for example, include a gate terminal, first and second source-drain terminals, and a body terminal. The body terminal may be connected to a well region (e.g., a p-well for an n-channel transistor or an n-well for a p-channel transistor) in which the first and second source-drain terminals are formed. The body terminal may be reversed biased, which increases the transistor threshold voltage level and can help reduce sub-threshold leakage.

For example, the body terminal of an n-channel transistor may be supplied with a negative voltage. Supplying a negative voltage to the body terminal of an re-channel device reverse biases the p-n junction between the n+ source-drain regions and the p-well of the n-channel transistor. If the p-well of the n-channel transistor, however, is formed too close to a gate structure (e.g., a polysilicon gate structure) of a neighboring transistor, a substantial amount of leakage may be generated if the gate structure of the neighboring transistor is biased to a positive power supply voltage level.

Computer-aided design (CAD) tools may be used to identify potentially leaky regions on the integrated circuit. For example, the CAD tools may be used to identify all actively driven gate terminals and all actively driven well regions. The CAD tools may then check whether each gate-well pair is placed sufficiently close to one another (e.g., if the distance between the gate structure and the well region is greater than a predetermined threshold level, the amount of inter-transistor generated as a result may be tolerable). If the distance between the gate structure of one transistor and the well region of an adjacent transistor is greater than the predetermined threshold, the gate structure may be marked (registered) as satisfying design criteria, and a successive gate-well pair may be examined. If the distance between the gate structure of one transistor and the well region of an adjacent transistor is less than the predetermined threshold, that gate structure may be flagged as failing design criteria.

All flagged gate structures may be cut using a gate cut layer (sometimes referred to as a cut polysilicon layer). The CAD tools may, for example, be used to identify an existing gate cut layer in the vicinity of the flagged gate structure and may extend the existing gate cut layer to cut the flagged gate structures into multiple segments. The extended gate cut layer serves to sever the actively driven gate into at least first and second segments, where the first segment that is physically adjacent to the reverse biased well region is floating and where the second segment that extends over the source-drain regions of the neighboring transistor is still actively biased. Because the portion closest to the reverse biased well region is now floating, the voltage difference between the reverse biased well region and the floating gate segment is reduced, thereby substantially eliminating inter-transistor leakage.

Further features of the present invention, its nature and various advantages will be more apparent from the accompanying drawings and the following detailed description.

DETAILED DESCRIPTION

The present invention relates to transistors such as metal-oxide-semiconductor transistors. Metal-oxide-semiconductor transistors such as n-channel transistors and p-channel transistors are formed in a semiconductor substrate. Each transistor may include a pair of source-drain regions that are separated by a channel region. A conductive gate structure may be formed over the channel region. A dielectric layer may be interposed between the conductive gate structure and the surface of the substrate in the channel region.

It is generally desirable to form transistors close to one another in an effort to conserve die area and reduce manufacturing cost. In modern complementary metal-oxide-semiconductor (CMOS) fabrication processes, some transistors may be formed sufficiently close as to generate unwanted leakage currents between adjacent transistors. For example, consider a scenario in which a first transistor is formed in the vicinity of a neighboring second transistor. In particular, the first transistor may be formed in a well region that is located immediately adjacent to the gate structure of the second transistor. If the well region of the first transistor and the gate structure of the second transistor are biased such that a large voltage differential is created, substantial leakage current may flow from the gate structure of the second transistor into the well region of the first transistor. Inter-transistor leakage currents generated in this way may consume an unacceptable amount of power. It may therefore be desirable to be able to identify and remedy such potential areas of leakage on an integrated circuit.

Metal-oxide-semiconductor (MOS) transistors in accordance with embodiments of the present invention may be used on any suitable type of integrated circuit. Integrated circuits in which the transistors may be used include programmable logic device integrated circuits, microprocessors, logic circuits, analog circuits, application specific integrated circuits, memory, digital signal processors, analog-to-digital and digital-to-analog converter circuits, etc.

Figure 1:
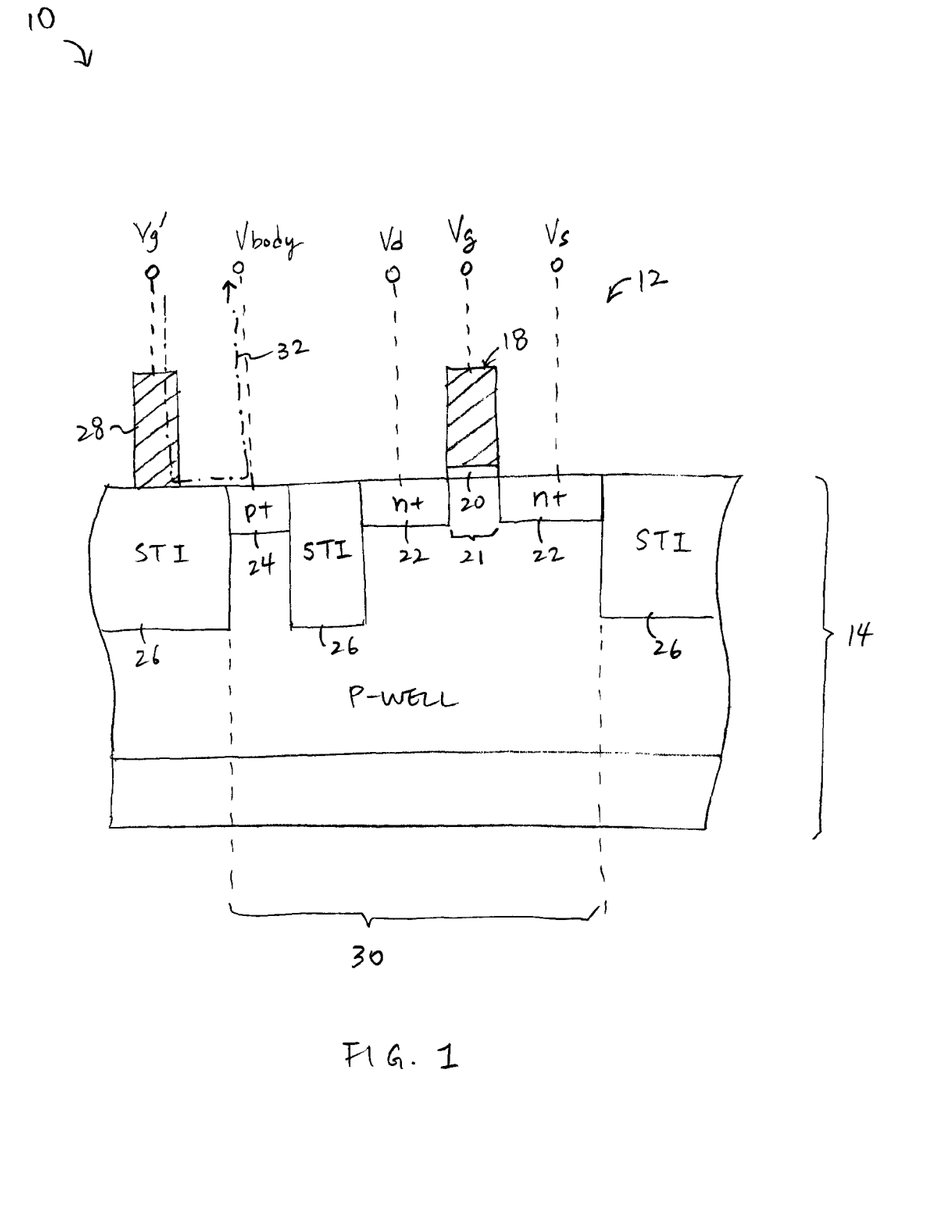
FIG. 1 is a cross-sectional side view of a transistor that is formed adjacent to a gate structure of a neighboring transistor in accordance with an embodiment of the present invention.

FIG. 1 is a cross-sectional side view of an integrated circuit 10 formed in a semiconductor substrate 14. As shown in FIG. 1, a transistor such as n-channel transistor 12 may be formed in substrate 14. Transistor 12 may include a pair of source-drain regions 22 (e.g., n+ doping regions) separated by an associated channel region 21. A conductive gate structure such as polysilicon gate structure 18 (or other metal gate structures) may be formed over channel region 21. Gate dielectric layer 20 (sometimes referred to as a gate oxide layer) may be interposed between gate structure 18 and the surface of substrate 14 in channel region 21. Gate structure 18 may serve as a gate terminal for transistor 12 (e.g., gate structure 18 may be supplied with gate voltage Vg), whereas the two source-drain regions 22 may serve as either drain and/or source terminals for transistor 12 (e.g., regions 22 may receive drain voltage Vd and source voltage Vs). The terms "source" and "drain" may sometimes be used interchangeably when referring to a MOS transistor.

N-channel transistor 12 may be formed in a p-well (e.g., a region in the substrate that is lightly doped with p-type dopants). Transistor 12 may also include a body (bulk) tap region such as p+ tap region 24. Region 24 may serve as a body terminal for transistor 12 (e.g., body tap region may receive body biasing voltage Vbody) and may be used to bias p-well 30 of n-channel transistor 12 to any desired voltage level. Voltage Vbody may be equal to at least one of Vs and Vd, may be less than Vs and Vd (to reverse bias the bulk of transistor 12), and may be set to be greater than at least one of Vs and Vd (to forward bias the bulk of transistor 12), as examples. In one suitable embodiment of the present invention, bulk tap region 24 may receive a negative voltage for reverse biasing the body of n-channel transistor 12. Reverse body biasing n-channel transistor 12 in this way may increase transistor threshold voltage, which reduces sub-threshold leakage for transistor 12.

Body tap region 24 may be separated from at least one of source-drain regions 22 by a shallow trench isolation (STI) structure 26. In general, areas in substrate 14 that are not source-drain regions 22 (sometimes referred to as diffusion regions or oxide definition regions), transistor channel regions 21, or bulk tap regions 24 may be occupied by shallow trench isolation structures 26.

In the example of FIG. 1, well region 30 of transistor 12 may be formed adjacent to gate structure 28 associated with a neighboring transistor. Gate structure 28 may, for example, receive a high gate voltage Vg'. In a scenario in which Vg' is equal to a positive power supply voltage and Vbody is equal to a negative bias voltage, a large voltage difference may be developed (i.e., the difference between Vg' and Vbody may exceed a tolerable threshold level). In such scenarios, a substantial amount of leakage current may flow from gate 28 of one transistor into the negatively-biased well region 30 of the other neighboring transistor (as indicated by dotted path 32). Gate structure 28 that is actively biased need not be a gate structure of another transistor. Gate structure 28 may also be a dummy polysilicon structure or any other density compliance structure that is formed on device 10 to ensure that satisfactory planarity is achieved during chemical-mechanical planarization (CMP) polishing operations. In general, any actively driven conductive structure (whether or not it is part of a transistor) that is formed sufficiently close to a negatively biased well region 30 may be capable of generating undesired leakage currents.

Figure 2:
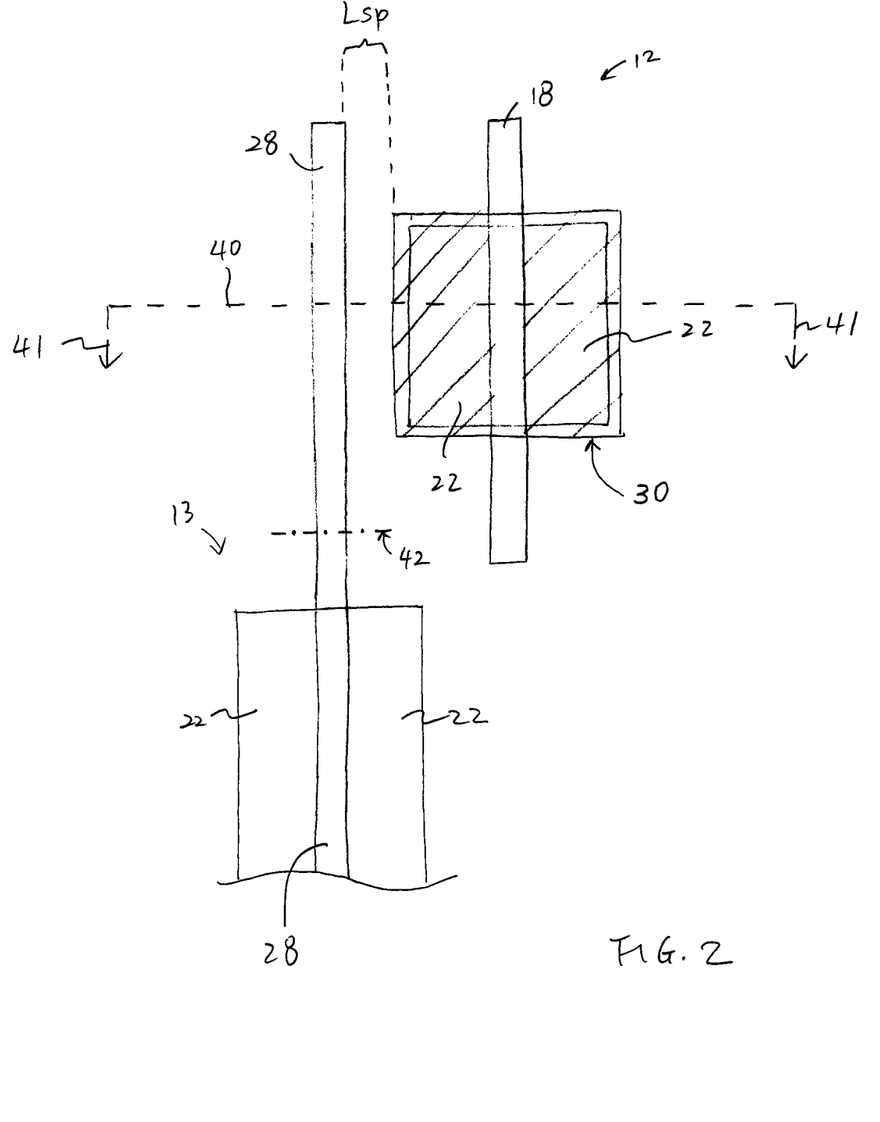
FIG. 2 is a top view of the two adjacent transistors of FIG. 1 in accordance with an embodiment of the present invention.

FIG. 2 is a top layout view of the two adjacent transistors described in connection with FIG. 1. In particular, FIG. 1 is the cross-sectional side view of the circuitry in FIG. 2 taken along dotted line 40 and viewed in direction 41. As shown in FIG. 2, well region 30 of transistor 12 may be formed at a distance Lsp from gate structure 28 of adjacent transistor 13. In this example, well region 30 may be reversed biased (e.g., the shaded p-well of transistor 12 may be supplied with a negative body biasing voltage).

Leakage current may be generated between reverse biased well region 30 and a corresponding portion of actively driven gate structure 28 if spacing Lsp is less than a predetermined threshold. For example, if Lsp exceeds the predetermined threshold, any leakage that can flow between gate 28 and well region 30 may be acceptable. If, however, Lsp is less than the predetermined threshold, the leakage between gate 28 and well region 30 may exceed tolerable levels. One approach of reducing such type of inter-transistor leakage is to place the two transistors further apart from one another.

It may not always be possible or desirable to place two transistors further apart just to ensure that Lsp meets design criteria (i.e., so that Lsp is greater than or equal to the predetermined threshold). One way of addressing this design constraint without physically shifting the location of the transistors is to cut the adjacent gate structure 28 into smaller segments such that a resulting segment that is facing the reverse biased well region 30 no longer receives a bias voltage. Gate structure 28 may, as an example, be cut segmented into at least two separate portions, as indicated by dotted line 42. A first severed segment may be floating, whereas a second severed segment may still be actively driven (e.g., cutting polysilicon gates in this way should not affect transistor operation). The voltage difference between the negatively biased well region 30 and the floating gate segment is reduced as a result of severing structure 28, thereby reducing leakage.

Figure 3:
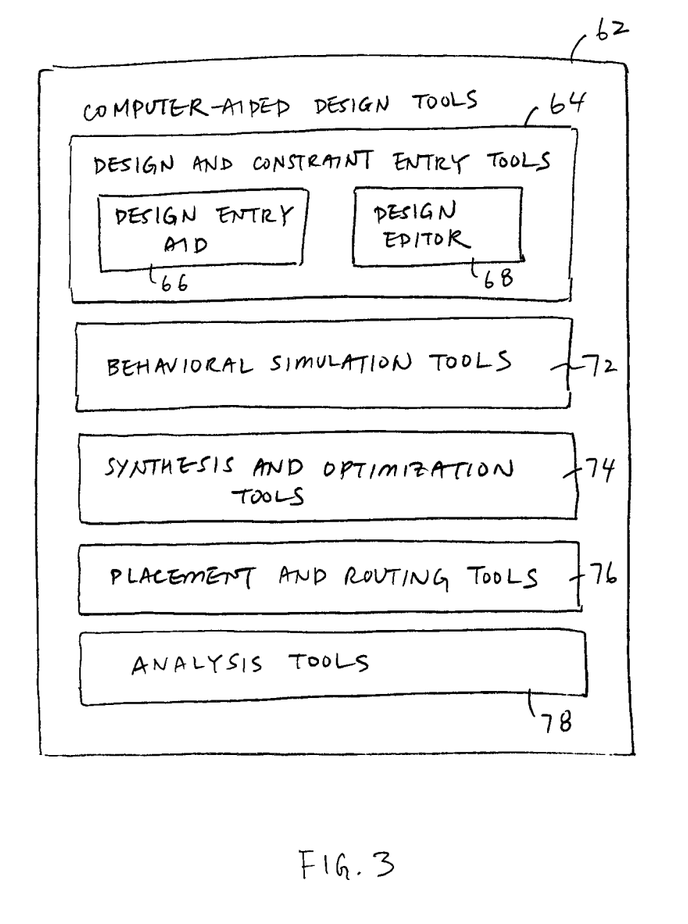
FIG. 3 is a diagram of illustrative computer-aided design (CAD) tools that may be used in a logic design system in accordance with an embodiment of the present invention.

Device 10 may be designed using computer-aided design tools such as illustrative computer-aided design (CAD) tools shown in FIG. 3. Device 10 may include logic circuits, input-output circuits, power supply circuitry, and other digital/analog circuitry. Design tools 62 may be implemented on computing equipment (e.g., a personal computer) and may be used to identify potential areas of leakage on device 10.

The design process typically starts with the formulation of logic circuit functional specifications. An integrated circuit designer can specify how a desired circuit should function using design and constraint entry tools 64. Design and constraint entry tools 64 may include tools such as design and constraint entry aid 66 and design editor 68. Design and constraint entry aids such as aid 66 may be used to help a designer locate a desired design from a library of existing designs and may provide computer-aided assistance to the designer for entering (specifying) the desired design. As an example, design and constraint entry aid 66 may be used to present screens of options for a user. The user may click on on-screen options to select whether the circuit being designed should have certain features. Design editor 68 may be used to enter a design (e.g., by entering lines of hardware description language code), may be used to edit a design obtained from a library (e.g., using a design and constraint entry aid), or may assist a user in selecting and editing appropriate prepackaged code/designs.

If desired, design and constraint entry tools 64 may allow the designer to provide a logic design using a hardware description language such as Verilog hardware description language (HDL) or Very High Speed Integrated Circuit Hardware Description Language (VHDL). The designer of the logic circuit can enter the logic design by writing hardware description language code with editor 68. Blocks of code may be imported from user-maintained or commercial libraries if desired.

After the design has been entered using design and constraint entry tools 64, behavioral simulation tools 72 may be used to simulate the functional performance of the design. If the functional performance of the design is incomplete or incorrect, the designer can make changes to the design using design and constraint entry tools 64. The functional operation of the new design can be verified using behavioral simulation tools 72 before synthesis operations have been performed using tools 74. Simulation tools such as tools 72 may also be used at other stages in the design flow if desired (e.g., after logic synthesis). The output of the behavioral simulation tools 72 may be provided to the logic designer in any suitable format (e.g., truth tables, timing diagrams, etc.).

Once the functional operation of the logic design has been determined to be satisfactory, logic synthesis and optimization tools 74 may be used to implement the logic design in a particular integrated circuit (i.e., in the logic and interconnect resources of a particular programmable integrated circuit product or product family).

Tools 74 attempt to optimize the design by making appropriate selections of hardware to implement different logic functions in the logic design based on the logic design data and constraint data entered by the logic designer using tools 64.

After logic synthesis and optimization using tools 74, placement and routing tools 76 may be used to perform physical design steps (layout synthesis operations). Placement and routing tools 76 are used to determine how to place the circuits for each logic function within device 10. For example, if two counters interact with each other, the placement and routing tools 76 may locate these counters in adjacent logic regions on the integrated circuit to minimize interconnect delays. The placement and routing tools 76 create orderly and efficient implementations of logic designs for a given integrated circuit.

After an implementation of the desired logic design in device 10 has been generated using placement and routing tools 76, the implementation of the design may be analyzed and tested using analysis tools 78.

Design tools 62 may be used to identify regions on device 10 that can potentially suffer from leakage issues. For example, design tools 62 may be used to identify all reverse biased well regions on device 10, to identify all actively driven gate structures on device 10, and to determine whether any one of the actively driven gate structures is placed too close to any one of the identified well regions.

Figure 4:
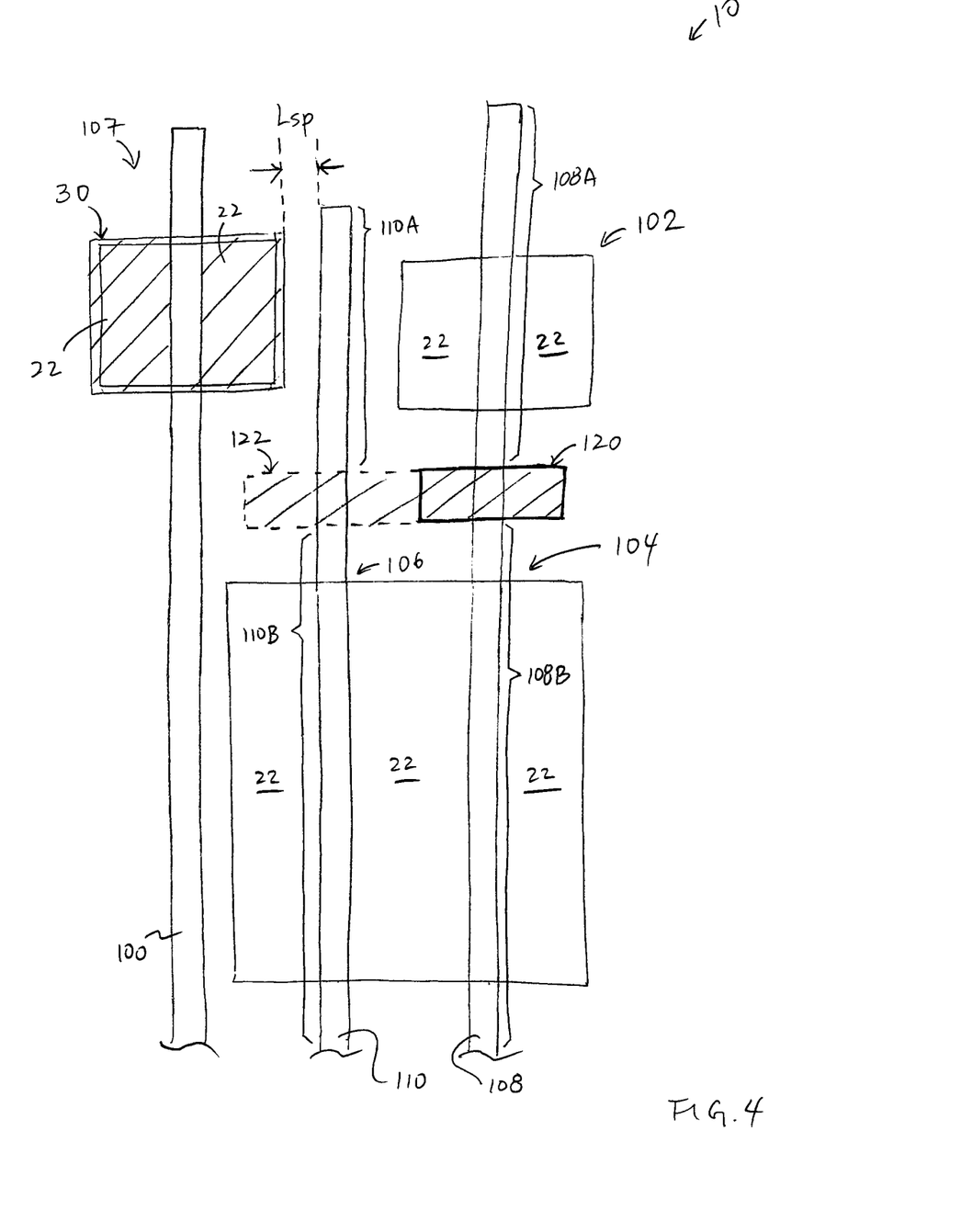
FIG. 4 is a top layout view illustrating a gate cut layer in accordance with an embodiment of the present invention.

FIG. 4 is a top layout view showing an instance in which a conductive gate structure should be cut using an existing gate cut layer. As shown in FIG. 4, integrated circuit 10 may include transistors 102, 104, 106, and 107. Transistor 102 may have a gate structure 108A, whereas transistor 104 may have a gate structure 108B. Gate structures 108A and 108B should not be electrically connected. In forming gate structures 108A and 108B, however, a continuous gate structure 108 may be disposed over the diffusion regions associated with transistors 102 and 104. Design tools 62 may then be used to specify a removal layer such as gate cut layer 120 (sometimes referred to as a cut polysilicon (CPO) layer). Cut layer 120 serves to ensure that gate structure 108 will be severed into respective segments 108A and 108B during the fabrication process. Gate cut layer 120 may be a type of masking layer that is temporarily formed over device 10 during an intermediate step in the fabrication process (e.g., to identify portions of gate structures that should be cut or etched) and may be removed before device 10 is packaged and shipped to customers.

Nominally, transistor 106 may have a continuous gate structure 110 and transistor 107 may have gate structure 100. Design tools 62 may identify that transistor 107 has a reverse biased well region 30 and that gate structure 110 of transistor 106 is actively driven to some positive voltage level. Design tools 62 may further be able to compute distance Lsp between well region 30 and gate structure 110. In the example of FIG. 4, spacing Lsp may be less than a predetermined threshold spacing. Design tools 62 may then be used to locate existing gate cut layer 120 and to further extend gate cut layer 120 (see, e.g., extension 122) so that gate structure 110 of transistor 106 will be cut into two separate segments 110A and 110B. Gate segment 110B may still be actively driven, so the functionality of transistor 106 will not be affected. Gate segment 110A, however, will no longer be biased to a positive voltage level (assuming the gate contact is located somewhere along segment 110B and not along 110A). As a result, any potential leakage that would have been present (prior to extending the gate cut layer) between region 30 of transistor 107 and gate structure 110 of transistor 106 is substantially eliminated. The example of FIG. 4 shows merely one illustrative circuit configuration in which a conductive gate structure can be cut and does not serve to limit the scope of the present invention.

Figure 5:
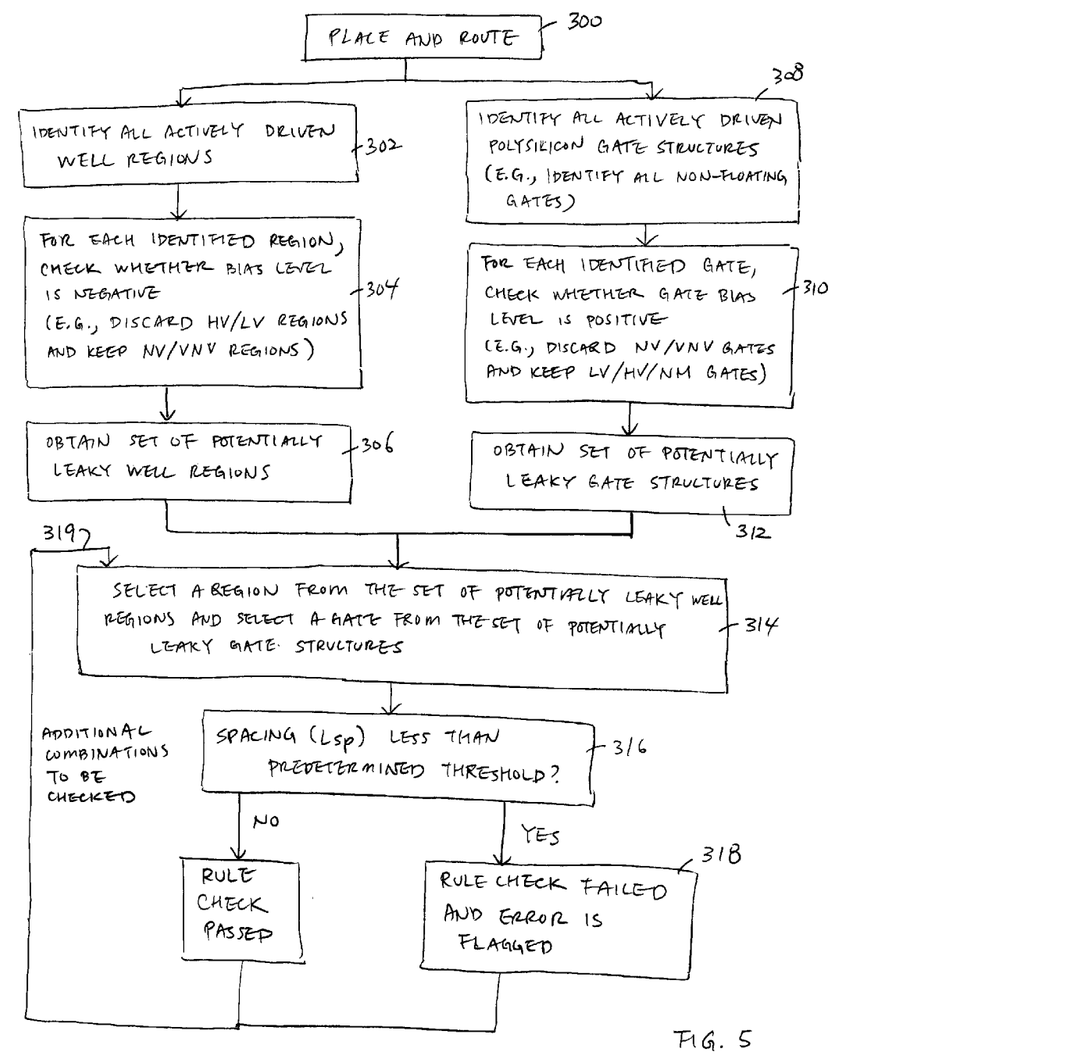
FIG. 5 is a flow chart of illustrative steps involved in identifying conductive gate structures to be cut in accordance with an embodiment of the present invention.

FIG. 5 is a flow chart of illustrative steps involved in identifying gate structures to be cut in accordance with an embodiment of the present invention.

At step 300, design tools 62 may perform initial placement and routing of transistors on device 10. At step 302, design tools 62 may be used to identify all actively driven well regions (e.g., all p-well regions that are actively driven). For each of the well regions identified in step 304, design tools 62 may be used to check whether its bias level is negative (step 304). For example, "high voltage" (HV) well regions (e.g., wells that are biased using voltages greater than a given positive power supply voltage level) and "low voltage" (LV) well regions (e.g., wells that are biased using voltages greater than zero volts but less than the given positive power supply voltage) may be discarded, whereas "negative voltage" (NV) well regions (e.g., wells that are biased using voltages less than zero volts and greater than −0.5 V) and "very negative voltage" (VNV) well regions (e.g., wells that are biased using voltages less than −0.5 V) may be stored for further processing. At step 306, a set of potentially leaky well regions may be obtained by gathering all of the stored well regions that have not been discarded during step 304.

The given positive power supply voltage may be equal to 1.2 V (as an example). As a point of reference, a nominal or core positive power supply voltage that is used to power a majority of logic circuits on device 10 may be equal to 0.85 V.

Steps 308, 310, and 312 may be performed concurrently with steps 302, 304, and 306. At step 308, design tools 62 may be used to identify all actively driven polysilicon gate structures (e.g., tools 62 may be used to identify all non-floating gates). For each of the gate structures identified in step 308, design tools 62 may be used to check whether its gate bias level is positive (step 310). For example, NV gate structures (e.g., gate structures that are biased using voltages less than zero volts and greater than −0.5 V) and VNV gate structures (e.g., gate structures that are biased using voltages less than −0.5 V) may be discarded, whereas LV gate structures (e.g., gate structures that are biased using voltages greater than zero volts and less than 1.2 V), HV gate structures (e.g., gate structures that are biased using voltages greater than 1.2 V), and "no marker" (NM) gate structures (e.g., gate structures that may be biased using the nominal positive power supply voltage or other possible voltage level) may be store for further processing. At step 312, a set of potentially leaky gate structures may be obtained by gathering all of the actively driven gate structures that have not been discarded during step 310.

At step 314, a well may be selected from the set of potentially leaky well regions (i.e., the set obtained in step 306) and a gate may be selected from the set of potentially leaky gate structures (i.e., the set obtained in step 312). At step 316, design tools 62 may be used to check whether the distance Lsp between the selected well region and the selected gate structure is less than a predetermined threshold. If Lsp is greater than the predetermined threshold, the selected well-gate pair satisfies design criteria. If Lsp is less than the predetermined threshold, the currently selected gate structure may be flagged (step 318). Processing may loop back to step 314 to check a new well-gate combination, as indicated by path 319. Steps 314 and 316 may be iterated until all possible well-gate combinations have been checked.

Figure 6:
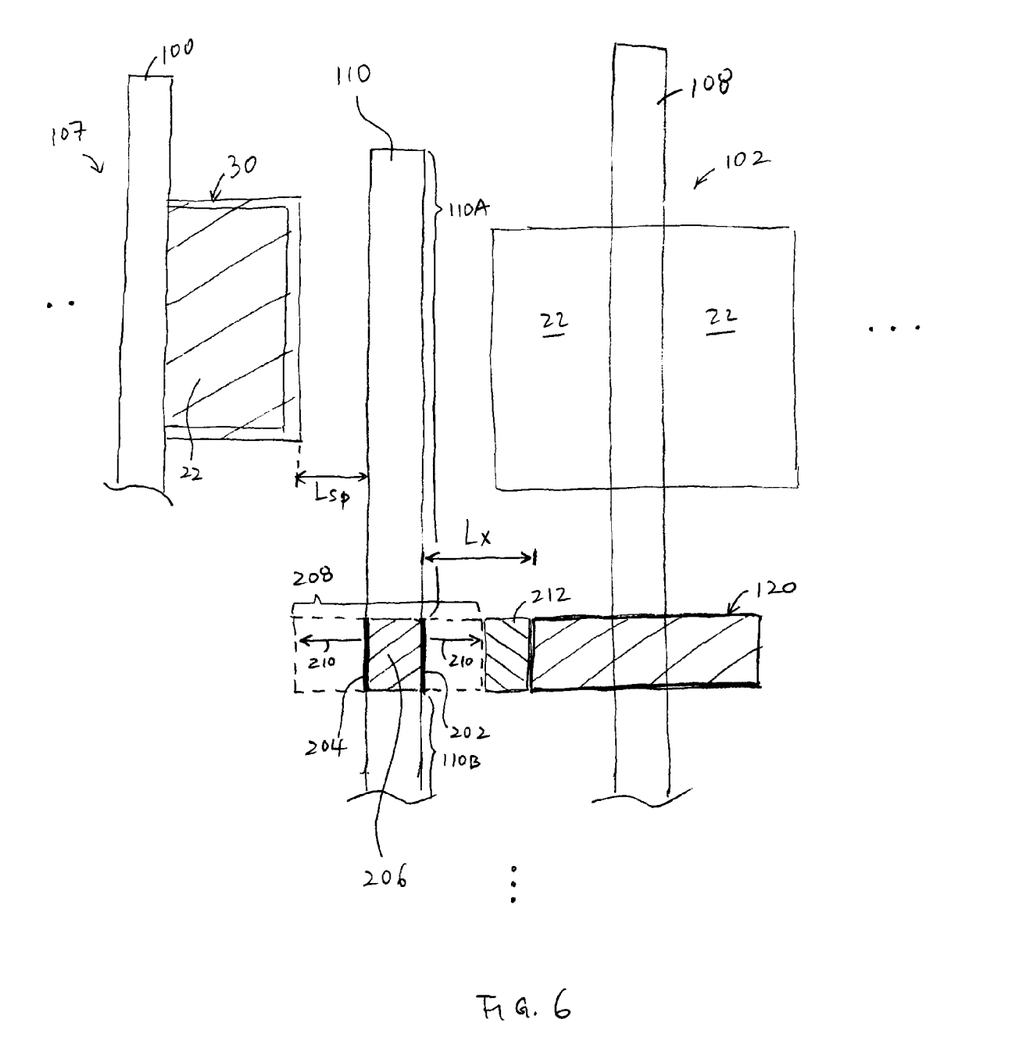
FIG. 6 is a top view showing how an existing gate cut layer may be extended in accordance with an embodiment of the present invention.

Once problematic regions on device 10 have been identified (flagged), design tools 62 may be used to extend existing gate cut layers to float the potentially leaky gate structures. FIG. 6 shows a more detailed portion of FIG. 4 to illustrate how an existing gate cut layer may be extended to cut an adjacent gate structure into multiple segments. As described in connection with FIG. 4, well region 30 of transistor 107 may be formed unacceptably close to actively driven gate structure 110 (e.g., gate structure 110 is flagged as being a potential source of leakage). Gate structure 110 may be selected as a candidate gate structure to be cut (see, e.g., step 400 of FIG. 7).

Figure 7:
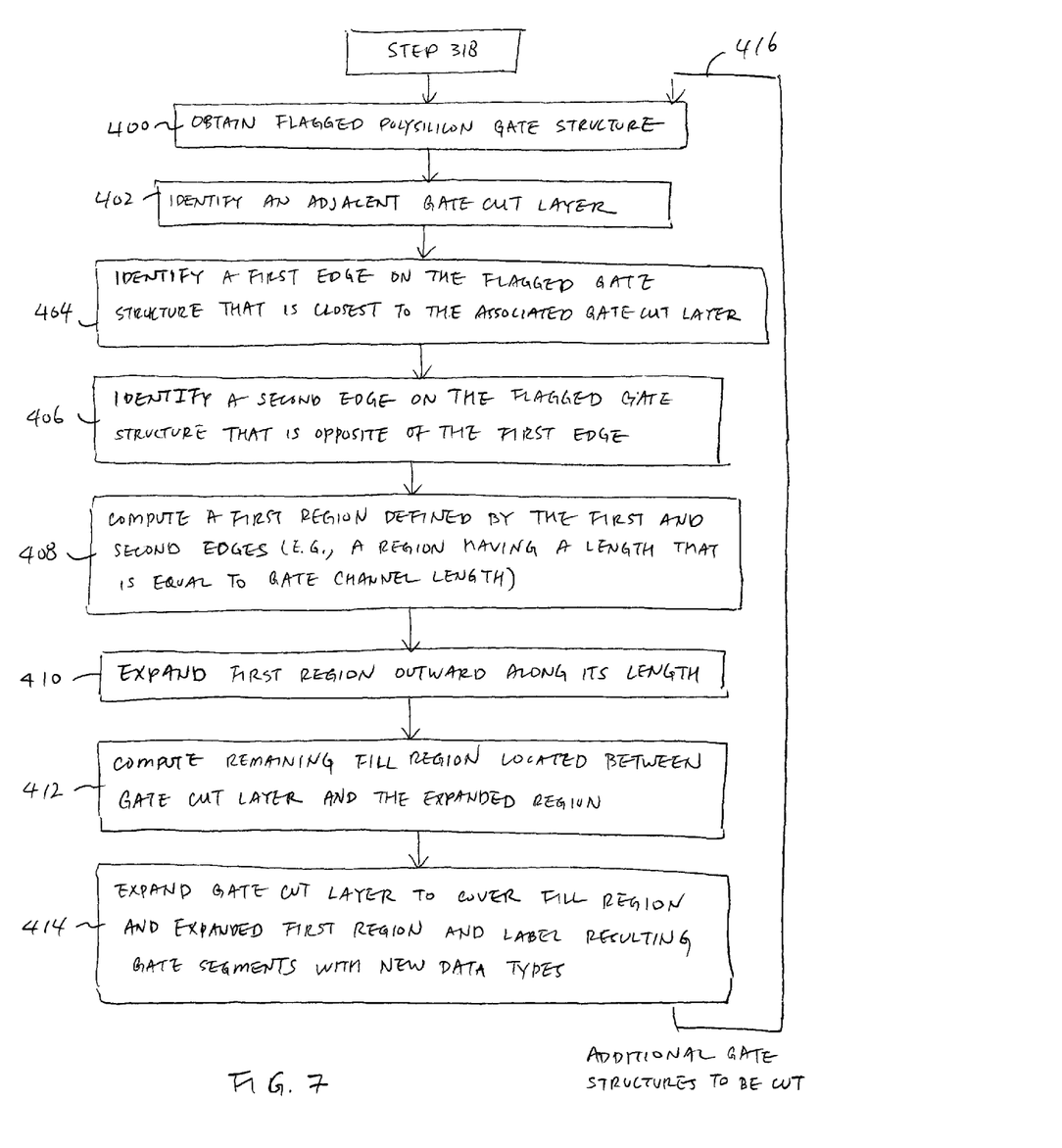
FIG. 7 is a flow chart of illustrative steps involved in extending an existing gate cut layer in accordance with an embodiment of the present invention.

At step 402, design tools 62 may be capable of identifying a gate cut layer that is formed in the vicinity of flagged gate structure 110 (see, FIG. 6, associated cut polysilicon layer 120 that is adjacent to gate 110). At step 404, design tools 62 may identify a first edge of flagged gate structure 110 that is closest to associated gate cut layer 120 (see, edge 202 in FIG. 6). At step 406, design tools 62 may identify a second edge of the flagged gate structure 110 that is opposite to the first edge (see, edge 204 in FIG. 6). At step 408, design tools 62 may be used to compute a first region that is delineated by the first and second edges (see, e.g., shaded region 206 in FIG. 6 having a length that is equal to the gate length of gate structure 110).

At step 410, the first region may be expanded outwards along its length to form a second elongated region 208, as shown by arrows 210. At step 412, design tools 62 may then be used to fill the remaining region located between gate cut layer 120 and expanded region 208 (see, gap region 212 in FIG. 6).

At step 414, design tools 62 may extend gate cut layer 120 to cover regions 208 and 212 and may assign the resulting gate segments with new data types. In general, each type of integrated circuit structure has a respective data layer identifier. For example, polysilicon gate structures, n-wells, p-wells, p+ diffusion regions, n+ diffusion regions, shallow trench isolation structures, metal routing paths, vias, and other integrated circuit structures may each have a unique data layer identifier.

Integrated circuit structures of a given data layer identifier may further be categorized into respective data types. For example, a polysilicon gate structure that is part of a transistor may have a first data type, whereas a dummy polysilicon structure that is merely formed for density compliance purposes and that is not part of a transistor may have a second data type. In the example of FIG. 6, floating gate segment 110A may be assigned a third data type that is different than the first and second data types, whereas severed gate segment 110B that is still actively driven may be assigned a fourth data type that is different than the first, second, and third data types. Data layer and data type information may be assigned using design tools 62 and may be used during integrated circuit fabrication procedures to help clarify the order in which each of the structures is to be formed.

Following step 414, processing may loop back to step 400 to cut additional polysilicon gate structures that have been flagged during step 318, as indicated by path 416. The steps of FIGS. 5 and 7 are merely illustrative and do not serve to limit the scope of the present invention. If desired, other methods of identifying potential areas of leakage and other approaches to cutting conductive gate structures may be used.

Figure 8:
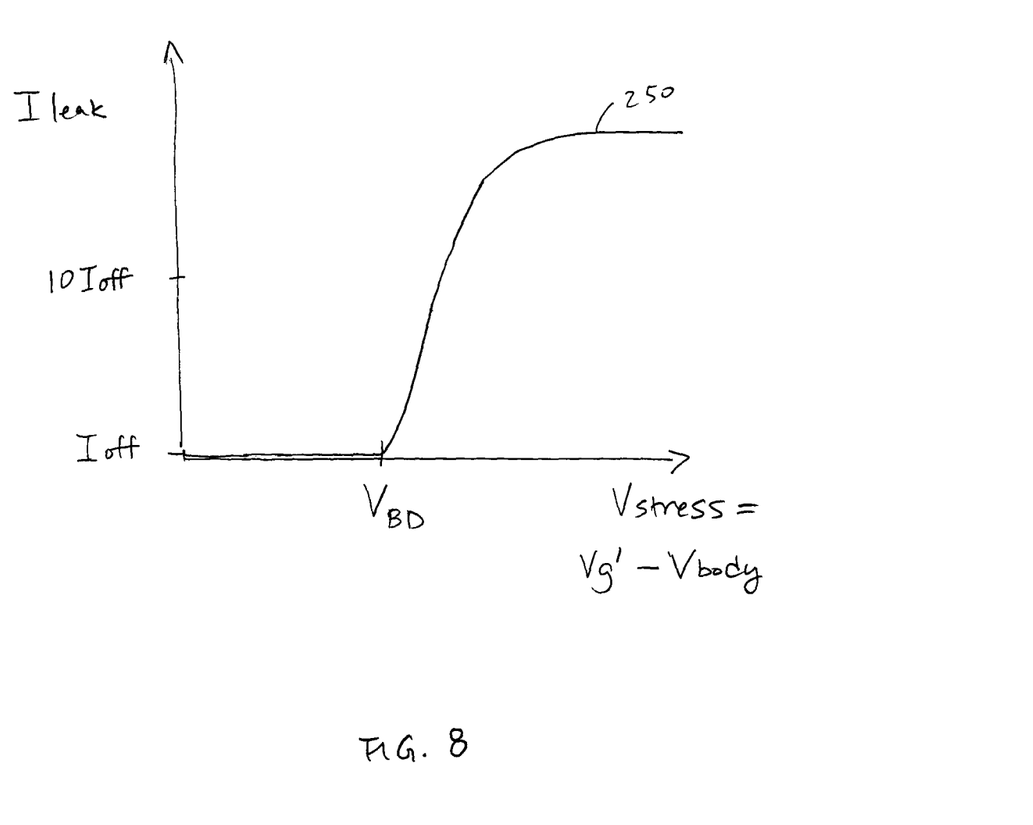
FIG. 8 is a plot showing how leakage current can be reduced by selectively cutting actively driven gate structures into smaller segments in accordance with an embodiment of the present invention.

FIG. 8 is a plot of leakage current Ileak (e.g., leakage current 32 as shown in FIG. 1) versus the voltage difference between voltage Vg' that is used to drive a gate of a first transistor and voltage Vbody that is used to bias a well region associated with a second transistor that is formed sufficiently close to the first transistor. This voltage difference may be referred to herein as Vstress (i.e., Vstress is equal to Vg' minus Vbody). Curve 250 shows how leakage current may substantially increase if Vstress exceeds a threshold breakdown voltage $V_{BD}$. If Vstress is less than $V_{BD}$, Ileak may exhibit a low leakage current Ioff (e.g., less than 0.1 mA). If, however, Vstress increases beyond $V_{BD}$, Ileak may increase to more than ten times Ioff, which may consume an undesired amount of power. Breakdown voltage $V_{BD}$ may be equal to 1.2 V (as an example). Flagging potentially problematic gate structures that are formed too close to reverse biased well regions and cutting the associated gate structures may help reduce Vstress for the resulting gate segment to less than $V_{BD}$, thereby substantially reducing leakage current and power consumption. The examples described herein where the p-well of n-channel transistors and the gate structures that are driven using positive power supply voltages are merely illustrative and do not serve to limit the scope of the present invention. If desired, design tools 62 may be used to identify portions of p-channel transistors that are reverse-biased, gate structures that are actively driven using negative voltages, or other integrated structures that are formed close to one another such that a large voltage differential between the two can result in substantial leakage and reliability issues.

Figure 9:
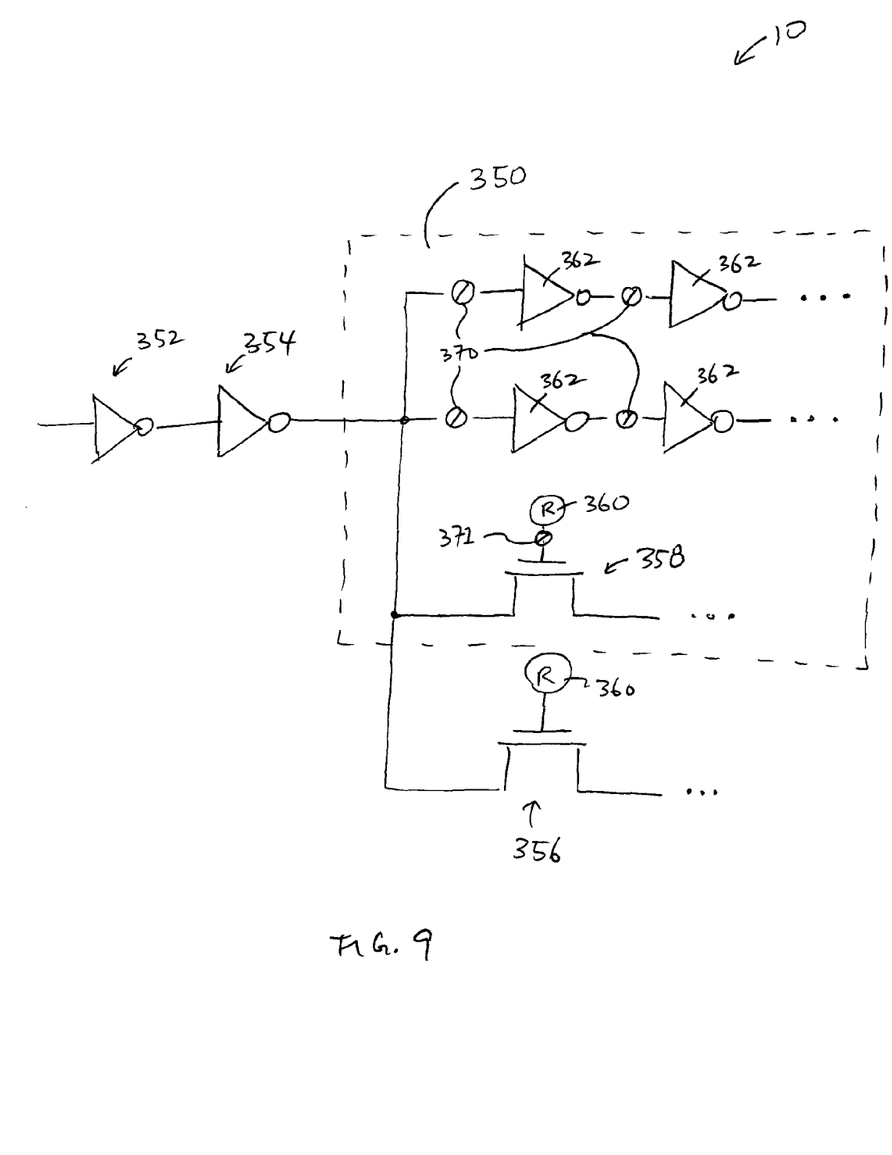
FIG. 9 is a diagram showing how unused logic circuits may be decoupled from active logic circuits by cutting selected conductive gate structures in accordance with an embodiment of the present invention.

In general, this process of identifying particular groups of gate structures to be cut and segmenting at least a portion of the identified gate structures may also be used in a programmable integrated circuit. As shown in FIG. 9, programmable integrated circuit 10 may include a plurality of logic gates such as inverters (e.g., inverters 352, 354, and 362), pass transistors (e.g., pass gates 356 and 358), and other logic circuitry.

Depending on the user-selected functionality, a portion of the logic circuitry may be active, whereas a portion of the logic circuitry need not be switched in use. In the example of FIG. 9, circuit portion 350 may be inactive. One way of disabling inactive logic circuitry is to cut their gate terminals so that they are no longer being supplied with power or so that they are no longer connected to the active circuitry. For example, logic inverting circuits 362 may have their gate terminals severed (as indicated by markers 370) so that they are no longer coupled to other operational circuitry. Similarly, pass transistors such as pass transistor 358 may have its gate terminal severed (as indicated by marker 371) so that it can no longer be controlled using user-supplied configuration data bits provided by configuration random-access memory cell 360. The active circuits such as inverter 352 and 354 and pass transistor 356 may have their gate terminals intact and may be coupled in series or in any desired circuit routing configuration to provide the desired function. Identification of the gate terminals of the inactive gates and the active gates and the process of identifying which of the gate structures are to be cut may similarly be performed using design tools 62.

The foregoing is merely illustrative of the principles of this invention and various modifications can be made by those skilled in the art without departing from the scope and spirit of the invention. The foregoing embodiments may be implemented individually or in any combination.

What is claimed is:

1. A method of designing an integrated circuit using integrated circuit design tools implemented on computing equipment, comprising:
   with the integrated circuit design tools implemented on the computing equipment, identifying at least one transistor well region associated with a first transistor on the integrated circuit;
   with the integrated circuit design tools implemented on the computing equipment, identifying at least one transistor gate structure associated with a second transistor on the integrated circuit;
   with the integrated circuit design tools implemented on the computing equipment, computing a distance that separates the transistor well region and the transistor gate structure; and
   with the integrated circuit design tools implemented on the computing equipment, determining whether the transistor gate structure should be cut into multiple segments based on the computed distance.

2. The method defined in claim 1 wherein identifying the at least one transistor well region comprises identifying at least one transistor well region that is designed to be reversed biased.

3. The method defined in claim 1 wherein the integrated circuit is designed to be supplied with high and low power supply voltages and wherein identifying the at least one transistor well region comprises identifying at least one transistor well region that is designed to receive a voltage that is less than the low power supply voltage.

4. The method defined in claim 1 wherein identifying the at least one transistor gate structure comprises identifying at least one transistor gate structure that is designed to be actively biased.

5. The method defined in claim 1 wherein the integrated circuit is designed to be supplied with high and low power supply voltages and wherein identifying the at least one transistor gate structure comprises identifying at least one transistor gate structure that is designed to receive a voltage that is greater than the low power supply voltage.

6. The method defined in claim 1 further comprising:
   in response to determining that the computed distance is greater than a predetermined threshold value, registering the transistor gate structure as satisfying design criteria.

7. The method defined in claim 6 further comprising:
   in response to determining that the computed distance is less than the predetermined threshold value, registering the transistor gate structure as failing design criteria.

8. The method defined in claim 5 further comprising:
   identifying an existing gate cut layer on the integrated circuit, wherein the gate cut layer serves to specify portions on the integrated circuit that should be devoid of transistor gate structures.

9. The method defined in claim 8 further comprising:
extending the gate cut layer to further specify cutting the at least one transistor gate structure into at least first and second segments, wherein at least one of the first and second segments is designed to no longer receive the voltage that is greater than the low power supply voltage.

10. A method of designing an integrated circuit using integrated circuit design tools implemented on computing equipment, comprising:
with the integrated circuit design tools implemented on the computing equipment, identifying a transistor gate structure on the integrated circuit as being a potential source of leakage; and
with the integrated circuit design tools implemented on the computing equipment, identifying an existing gate cut layer in the vicinity of the transistor gate structure, wherein the gate cut layer serves to specify locations at which transistor gate structures should be cut into multiple segments during integrated circuit fabrication processes.

11. The method defined in claim 10 further comprising:
reducing leakage between the transistor gate structure and a neighboring transistor well region by extending the existing gate cut layer to cut the transistor gate structure, wherein the transistor gate structure and the neighboring transistor well region each belong to respective transistors on the integrated circuit.

12. The method defined in claim 11 wherein extending the existing gate cut layer to cut the identified transistor gate structure comprises extending the existing gate cut layer to cut the identified transistor gate structure into a first segment that receives a bias voltage and a second segment that does not receive any bias voltage.

13. The method defined in claim 11 wherein extending the existing gate cut layer comprises:
identifying a first edge along the transistor gate structure that is closest to the gate cut layer; and
identifying a second edge along the transistor gate structure that is opposite to the first edge.

14. The method defined in claim 13 wherein extending the existing gate cut layer further comprises:
computing a first region within the transistor gate structure that is defined by the first and second edges, wherein the first region has a length that is designed to be equal to a gate length associated with the transistor gate structure.

15. The method defined in claim 14 wherein extending the existing gate cut layer further comprises:
expanding the first region outwards along its length;
computing a second region interposed between the expanded first region and the existing gate cut layer; and
extending the existing gate cut layer to cover the first and second regions.

16. A method of forming an integrated circuit comprising:
forming a transistor well region;
forming a transistor gate structure; and
reducing leakage between the transistor well region and the transistor gate structure by cutting the transistor gate structure into multiple segments.

17. The method defined in claim 16 wherein the transistor well region comprises a reverse biased p-well and wherein the transistor gate structure is actively driven to a high voltage level.

18. The method defined in claim 16 wherein the transistor well region comprises a reverse biased n-well and wherein the transistor gate structure is actively driven to a low voltage level.

19. The method defined in claim 16 wherein the transistor gate structure initially receives a bias voltage and wherein cutting the transistor gate structure into multiple segments comprises cutting the transistor gate structure into a first segment that receives the bias voltage and a second segment that no longer receives the bias voltage.

20. The method defined in claim 16 wherein cutting transistor gate structure into multiple segments comprises etching away a portion of the transistor gate structure.

* * * * *